(12) United States Patent
Wyatt et al.

(10) Patent No.: US 10,796,935 B2
(45) Date of Patent: Oct. 6, 2020

(54) ELECTRONIC DEVICE MANUFACTURING SYSTEMS, METHODS, AND APPARATUS FOR HEATING SUBSTRATES AND REDUCING CONTAMINATION IN LOADLOCKS

(71) Applicant: Applied Materials, Inc., Santa Clara, CA (US)

(72) Inventors: Adam J. Wyatt, Round Rock, TX (US); Edward Ng, San Jose, CA (US); Andrew Nguyen, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 533 days.

(21) Appl. No.: 15/462,203

(22) Filed: Mar. 17, 2017

(65) Prior Publication Data

US 2018/0270910 A1 Sep. 20, 2018

(51) Int. Cl.
*H01L 21/67* (2006.01)

(52) U.S. Cl.
CPC .. *H01L 21/67248* (2013.01); *H01L 21/67109* (2013.01); *H01L 21/67201* (2013.01)

(58) Field of Classification Search
CPC ......... H01L 21/67248; H01L 21/67109; H01L 21/67201; H01L 21/67126; H01L 21/67098; H01L 21/6719
See application file for complete search history.

(56) References Cited

U.S. PATENT DOCUMENTS

| | | | |
|---|---|---|---|
| 6,234,107 B1 | 5/2001 | Tanaka et al. | |
| 6,273,962 B1 | 8/2001 | Wu et al. | |
| 6,358,859 B1 | 3/2002 | Lo et al. | |
| 6,410,889 B2 | 6/2002 | Davis et al. | |
| 7,976,635 B2 | 7/2011 | Kurita et al. | |
| 9,177,842 B2 | 11/2015 | Englhardt et al. | |
| 9,337,014 B1 | 5/2016 | Galburt et al. | |
| 9,355,876 B2 | 5/2016 | Reuter et al. | |
| 9,378,994 B2 | 6/2016 | Weaver et al. | |
| 2009/0014324 A1 | 1/2009 | Kawaguchi et al. | |
| 2010/0190343 A1* | 7/2010 | Aggarwal | H01L 21/67201 438/694 |

(Continued)

FOREIGN PATENT DOCUMENTS

CN 101507959 A 8/2009

OTHER PUBLICATIONS

International Search Report and Written Opinion of International Application No. PCT/US2018/020879 dated Jun. 18, 2018.

(Continued)

*Primary Examiner* — Shawntina T Fuqua
(74) *Attorney, Agent, or Firm* — Lowenstein Sandler LLP

(57) ABSTRACT

An electronic device manufacturing system may include a loadlock. The loadlock may include a plurality of gas line heaters for providing a heated gas to the loadlock to heat a processed substrate therein. Heating a processed substrate may reduce corrosion in the loadlock and subsequent contamination of substrates therein. The loadlock may also include a plurality of embedded heaters in the loadlock housing to reduce moisture therein, further reducing corrosion and contamination. Methods of heating a substrate in a loadlock are also provided, as are other aspects.

20 Claims, 4 Drawing Sheets

(56) References Cited

U.S. PATENT DOCUMENTS

| | | | |
|---|---|---|---|
| 2014/0178157 A1* | 6/2014 | Hofmeister | ....... H01L 21/67126 |
| | | | 414/217 |
| 2015/0045961 A1 | 2/2015 | Koshti et al. | |
| 2015/0311102 A1 | 10/2015 | Weiss et al. | |
| 2015/0357228 A1 | 12/2015 | Busche et al. | |
| 2016/0314997 A1 | 10/2016 | Reuter et al. | |

OTHER PUBLICATIONS

Busche, U.S. Appl. No. 14/920,758 (22674), "Optical Fiber Temperature Sensors, Temperature Monitoring Apparatus, and Manufacturing Methods," filed Oct. 22, 2015.

* cited by examiner

ELECTRONIC DEVICE MANUFACTURING SYSTEMS, METHODS, AND APPARATUS FOR HEATING SUBSTRATES AND REDUCING CONTAMINATION IN LOADLOCKS

FIELD

This disclosure relates to electronic device manufacturing and, more particularly, to heating loadlocks and substrates therein to reduce corrosion and contamination.

BACKGROUND

An electronic device manufacturing system may include a factory interface (which may be, e.g., an Equipment Front End Module or EFEM) configured to receive substrates upon which electronic devices may be manufactured. The electronic device manufacturing system may also include a process tool, which may include a loadlock, a transfer chamber, and one or more process chambers. A substrate to be processed may be transferred from a substrate carrier (which may be a sealable container, such as, e.g., a Front Opening Unified Pod or FOUP), through the factory interface to the loadlock. From the loadlock, the substrate may be transferred to the transfer chamber, and from there to one or more process chambers. Once processed, the substrate may be returned to the loadlock for removal from the system. However, the surface of a processed substrate may adsorb reactant gases during processing that may be released in the loadlock. The releasing of gases may be referred to as outgassing. Outgassing may cause corrosion in the loadlock, particularly when combined with moisture that may be present on interior surfaces of the loadlock. This corrosion may, in turn, result in large quantities of particulates that can contaminate and adversely affect processing of substrates passing through the loadlock. Existing electronic device manufacturing systems may therefore benefit from improved loadlocks and methods that reduce corrosion and contamination therein.

SUMMARY

According to a first aspect, a loadlock of an electronic device manufacturing system is provided. The loadlock comprises a housing having a first interior chamber configured to receive a substrate therein from a transfer chamber of the electronic device manufacturing system, a plurality of gas lines coupled to the first interior chamber, a plurality of gas line heaters configured to heat a gas in one or more of the plurality of gas lines to deliver heated gas to the first interior chamber, a plurality of gas line temperature sensors coupled at different locations to the plurality of gas lines, and a gas line heater controller. The gas line heater controller is configured to receive one or more sensed gas temperatures from one or more of the plurality of gas line temperature sensors and to adjust a setting of one or more of the plurality of gas line heaters in response to receiving the one or more sensed gas temperatures.

According to a second aspect, an electronic device manufacturing system is provided. The electronic device manufacturing system comprises a process tool, a factory interface, and a loadlock coupled between a transfer chamber of the process tool and the factory interface. The loadlock comprises a housing having a first interior chamber configured to receive a substrate therein from the transfer chamber, a plurality of gas line heaters configured to heat a gas in one or more gas lines coupled to deliver heated gas to the first interior chamber, a plurality of gas line temperature sensors coupled at different locations to the one or more gas lines, and a gas line heater controller. The gas line heater controller is configured to receive one or more sensed gas temperatures from one or more of the plurality of temperature sensors and to adjust a setting of one or more of the plurality of gas line heaters in response to receiving the one or more sensed gas temperatures.

According to a third aspect, a method of heating a substrate in a loadlock of an electronic device manufacturing system is provided. The method comprises the following: receiving a processed substrate in the loadlock from a transfer chamber of the electronic device manufacturing system; increasing a pressure in the loadlock from a first value to a second value at a first rate of increase, the second value less than atmospheric pressure; flowing a heated gas into the loadlock for a period of time; discontinuing the flowing of the heated gas upon expiry of the period of time; and increasing the pressure in the loadlock to atmospheric pressure at a second rate of increase after the discontinuing, the second rate of increase higher than the first rate of increase.

Still other aspects, features, and advantages in accordance with these and other embodiments of the disclosure may be readily apparent from the following detailed description, the appended claims, and the accompanying drawings. Accordingly, the drawings and descriptions herein are to be regarded as illustrative in nature, and not as restrictive.

BRIEF DESCRIPTION OF DRAWINGS

The drawings, described below, are for illustrative purposes only and are not necessarily drawn to scale. The drawings are not intended to limit the scope of the disclosure in any way.

DETAILED DESCRIPTION

Reference will now be made in detail to example embodiments of the disclosure, which are illustrated in the accompanying drawings. Wherever possible, the same reference numbers will be used throughout the drawings to refer to the same or like parts.

To reduce corrosion that may occur in a loadlock of an electronic device manufacturing system, and subsequent particulate contamination of substrates passing through the loadlock, electronic device manufacturing systems in accordance with one or more embodiments of the disclosure may include improved loadlocks. The improved loadlocks may provide a heated gas to an interior chamber of the loadlock to heat a processed substrate therein. The heated gas may be an inert gas, such as, e.g., nitrogen. Heating a processed substrate may reduce, if not prevent, adsorbed reactant gases on the processed substrate from being released (i.e., outgassed or desorbed) into the loadlock. Desorbed gases may cause corrosion on interior loadlock surfaces, particularly when moisture is present. The corrosion may then result in large quantities of particulates that can contaminate and adversely affect processing of substrates passing through the loadlock. The improved loadlocks may include a plurality of gas line heaters that form multiple heating zones controlled by a gas line heater controller. The gas line heater controller may be configured to provide an interior chamber of a loadlock with a heated gas having a desired temperature by adjusting settings of one or more of the plurality of gas line heaters based on sensed gas line and interior chamber temperatures.

Electronic device manufacturing systems in accordance with one or more embodiments of the disclosure may also include improved loadlocks having a plurality of embedded heaters in a housing of the loadlock. The embedded heaters may be configured to reduce, if not prevent, moisture on interior surfaces of the loadlock that may contribute to corrosion in the loadlock. The plurality of embedded heaters may form multiple heating zones separately-controllable by a loadlock heating controller. One or more of the embedded heaters of a heating zone may have a different maximum heat output than the others of that heating zone. The loadlock heating controller may be configured to provide a desired temperature of a loadlock housing by adjusting settings of one or more of the embedded heaters based on loadlock housing temperatures sensed at different locations thereabout.

Further details of example embodiments illustrating and describing improved loadlocks in electronic device manufacturing systems, as well as other aspects including methods of heating a substrate in a loadlock of an electronic device manufacturing system, will be explained in greater detail below in connection with FIGS. 1-3.

Figure 1:
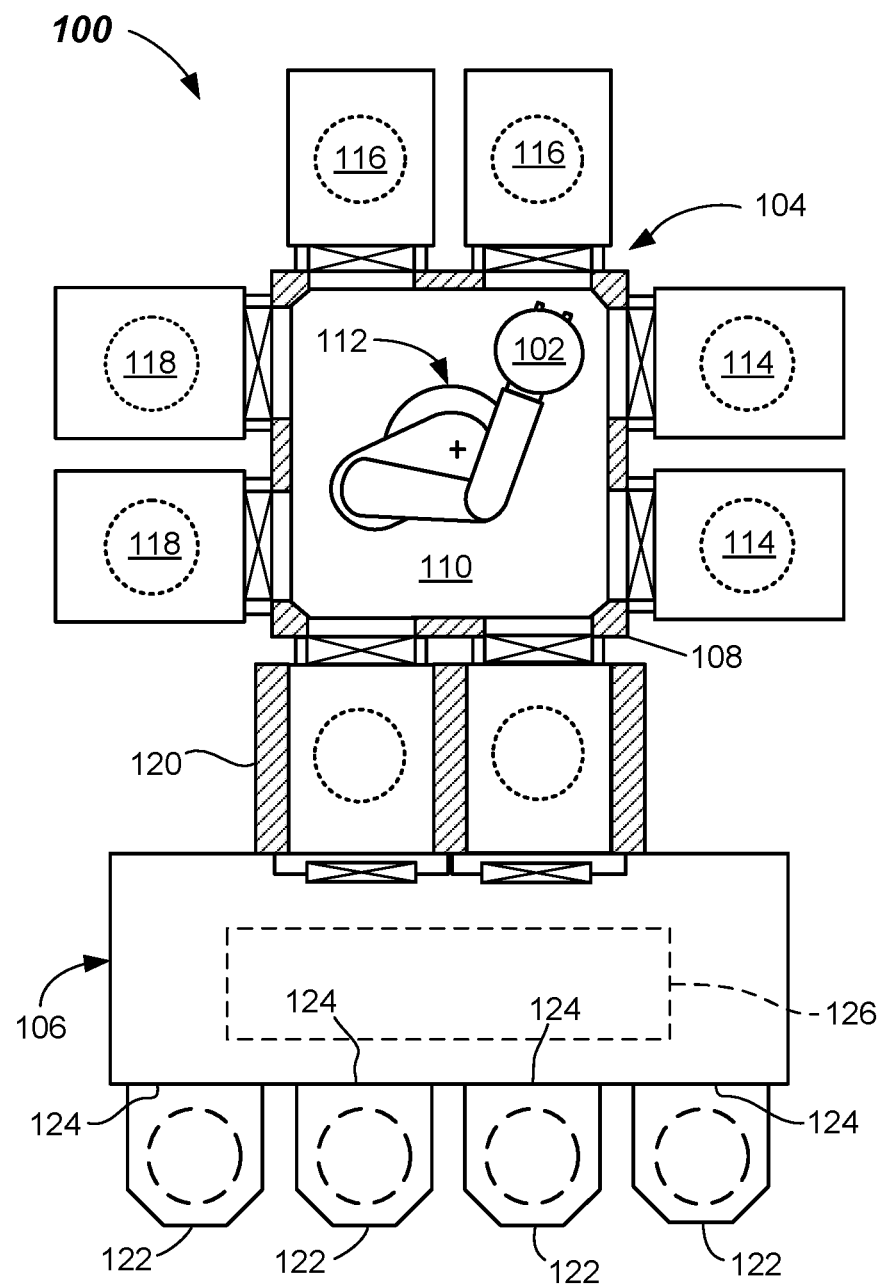
FIG. 1 illustrates a schematic top view of an electronic device manufacturing system (with covers removed) according to embodiments of the disclosure.

FIG. 1 illustrates an electronic device manufacturing system 100 in accordance with one or more embodiments. Electronic device manufacturing system 100 may perform one or more processes on a substrate 102. Substrate 102 may be any article, such as, e.g., a silicon-containing disc or wafer, a patterned wafer, a glass plate, or the like, suitable for fabricating electronic devices or circuit components thereon.

Electronic device manufacturing system 100 may include a process tool 104 and a factory interface 106 coupled to process tool 104. Process tool 104 may include a housing 108 having a transfer chamber 110 therein, and transfer chamber 110 may have a substrate transfer robot 112 located therein. A plurality of process chambers 114, 116, and 118 may be coupled to housing 108 and transfer chamber 110. A loadlock 120 may also be coupled to housing 108 and transfer chamber 110. Transfer chamber 110, process chambers 114, 116, and 118, and loadlock 120 may be maintained at a vacuum level. The vacuum level for the transfer chamber 110 may range from about, e.g., 0.01 Torr (10 mTorr) to about 80 Torr. Other vacuum levels may be used.

Transfer robot 112 may include multiple arms and one or more end effectors that are configured to transfer substrates 102 to and from any process chamber and loadlock physically coupled to transfer chamber 110 (note that substrates 102 and substrate placement locations are shown in FIG. 1 as circles).

A same or different substrate process may take place in each of process chambers 114, 116, and 118, such as, e.g., physical vapor deposition (PVD), chemical vapor deposition (CVD), etching, annealing, pre-cleaning, metal or metal oxide removal, or the like, on one or more substrates. For example, a PVD process may take place in one or both of process chambers 114, an etching process may take place in one or both of process chambers 116, and an annealing process may take place in one or both of process chambers 118. Other processes may be carried out on substrates therein.

Loadlock 120 may be configured to interface with, and be coupled to, transfer chamber 110 on one side and factory interface 106 on an opposite side. Loadlock 120 may have an environmentally-controlled atmosphere that may be changed from a vacuum environment (wherein substrates may be transferred to and from transfer chamber 110) to an atmospheric-pressure inert-gas environment (wherein substrates may be transferred to and from factory interface 106). In some embodiments, as described in more detail below in connection with FIGS. 2A-C, loadlock 120 may be a stacked loadlock having a pair of upper interior chambers and a pair of lower interior chambers that are located at different vertical levels (e.g., one above another). In some embodiments, the pair of upper interior chambers may be configured to receive processed substrates from transfer chamber 110 for removal from process tool 104, while the pair of lower interior chambers may be configured to receive substrates from factory interface 106 for processing in process tool 104.

Factory interface 106 may be any suitable enclosure, such as, e.g., an Equipment Front End Module or EFEM). Factory interface 106 may be configured to receive substrates 102 from substrate carriers 122 (e.g., Front Opening Unified Pods or FOUPs) docked at various load ports 124 of factory interface 106. A factory interface robot 126 (shown dotted) may be used to transfer substrates 102 between substrate carriers 122 and loadlock 120. Any conventional robot type may be used for factory interface robot 126. Transfers may be carried out in any order or direction. Factory interface 106 may be maintained in, e.g., a positive-pressure non-reactive gas environment (using, e.g., nitrogen as the non-reactive gas).

Figure 2A:
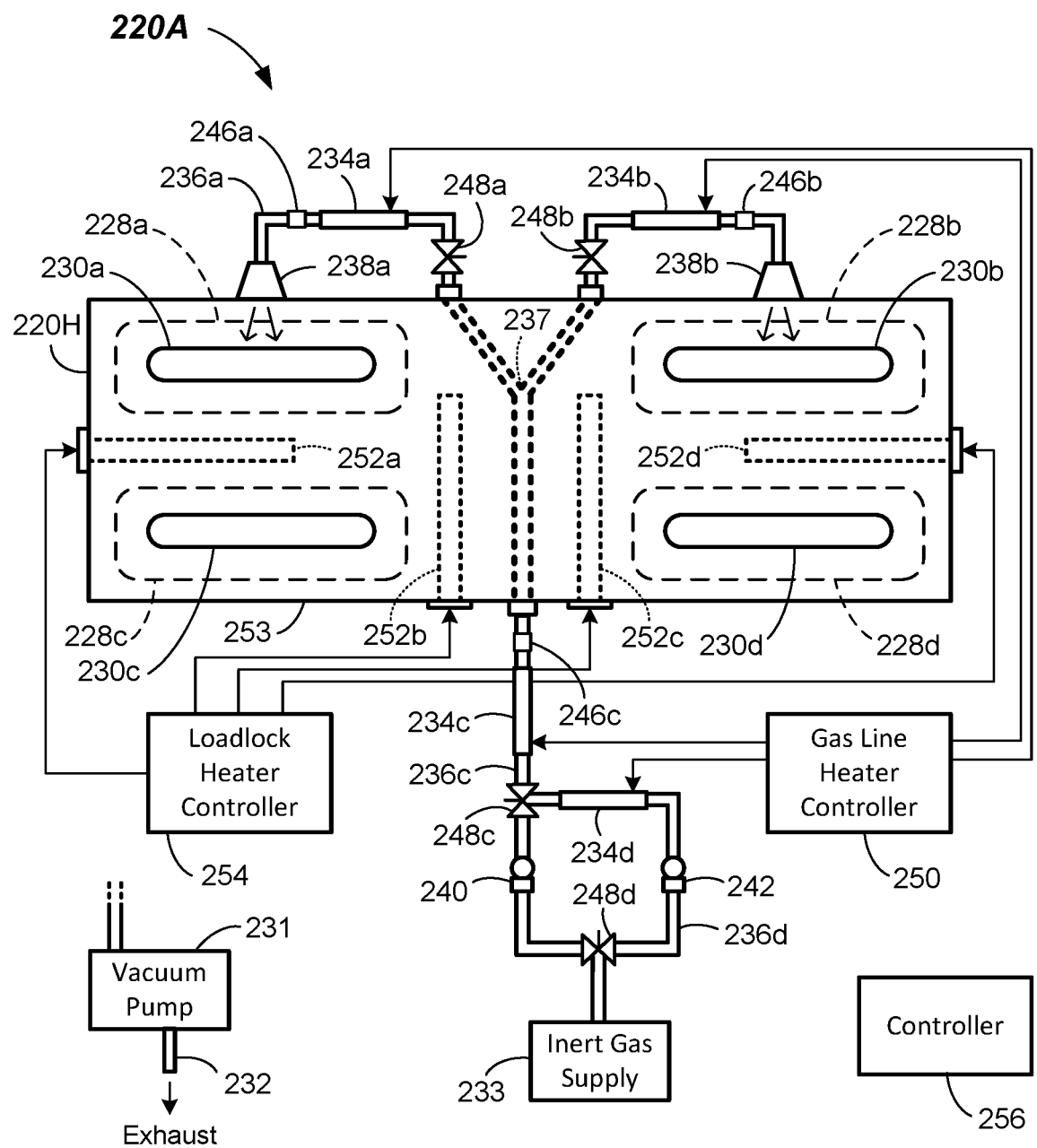
FIG. 2A illustrates a schematic front view of a loadlock according to embodiments of the disclosure.
Figure 2B:
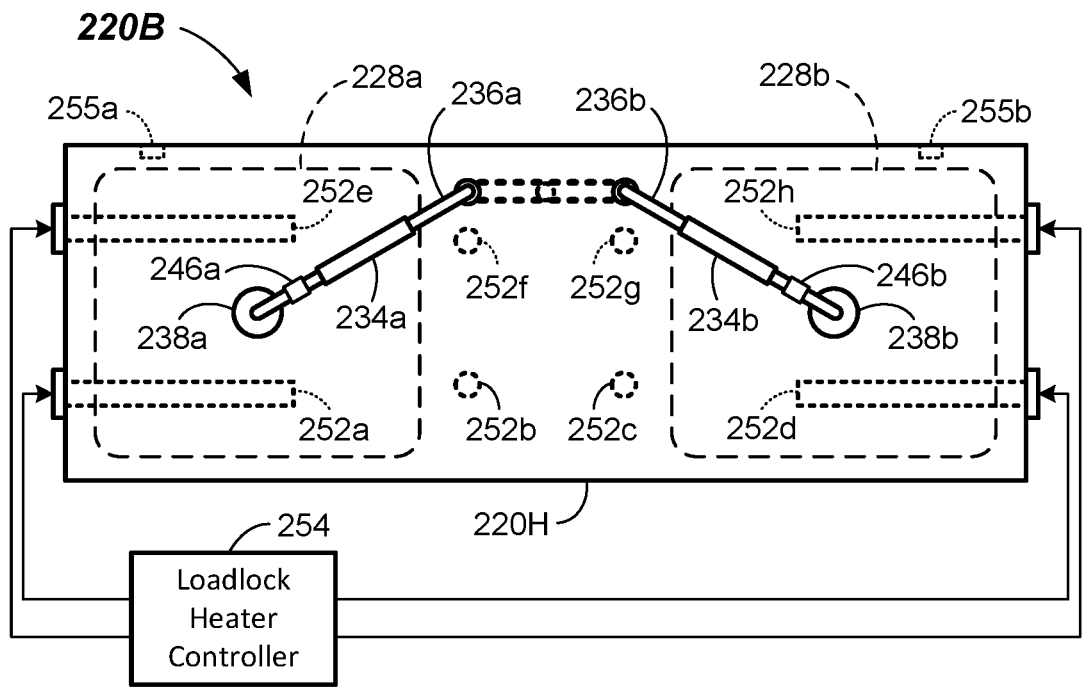
FIG. 2B illustrates a schematic top view of a loadlock according to embodiments of the disclosure.
Figure 2C:
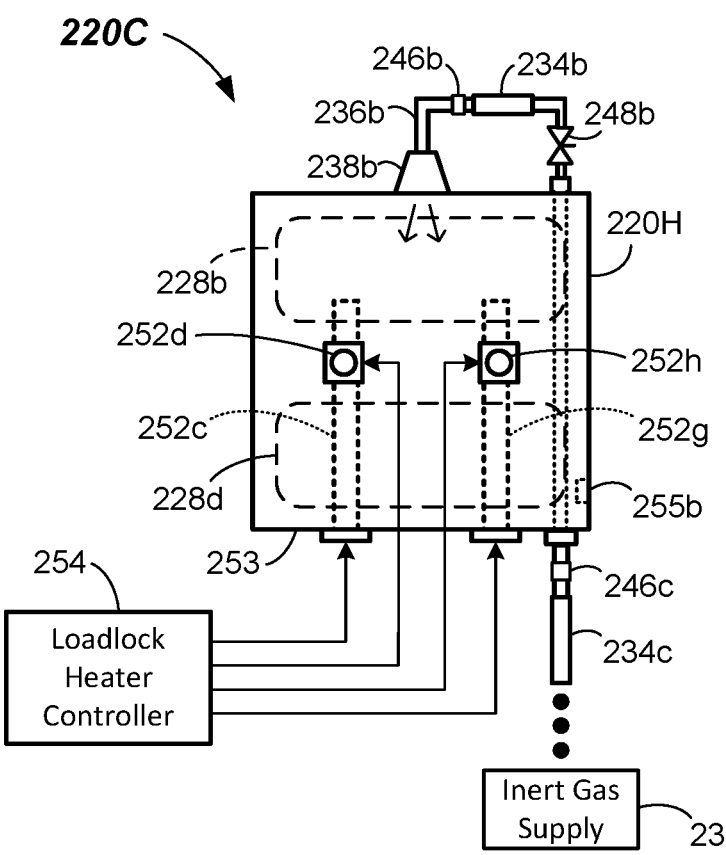
FIG. 2C illustrates a schematic right side view of a loadlock according to embodiments of the disclosure.

FIGS. 2A, 2B, and 2C illustrate front, top, and right side schematic views, respectively, of a loadlock of an electronic device manufacturing system in accordance with one or more embodiments. Loadlock 120 (FIG. 1) may be similar or identical to the loadlock of FIGS. 2A-C. As shown in FIG. 2A, loadlock 220A may be a stacked loadlock having a housing 220H that encloses a pair of upper interior chambers 228a and 228b and a pair of lower interior chambers 228c and 228d. Housing 220H may be, e.g., a single-piece machined aluminum block. Upper interior chambers 228a and 228b may be located at a different vertical level than lower interior chambers 228c and 228d (e.g., one pair above another).

Each of interior chambers 228a-d may have a respective opening 230a-d configured to receive a substrate therethrough. One or more conventional slit valves (i.e., doors; not shown) may be provided to open and close openings 230a-d. In some embodiments, a first slit valve (not shown) extending across loadlock 220A may simultaneously open and close upper openings 230a and 230b, while a second slit valve (not shown) also extending across loadlock 220A may simultaneously (and independently of the first slit valve) open and close lower openings 230c and 230d. Other slit valve configurations may be possible. Openings 230a-d may be configured to transfer substrates to and from a factory interface (e.g., factory interface 106 of FIG. 1). Loadlock 220A may have four identical and/or corresponding openings and slit valves located on a back side (not shown) configured to transfer substrates to and from a transfer chamber (e.g., transfer chamber 110 of FIG. 1). In some embodiments, upper interior chambers 228a and 228b may be configured to receive processed substrates from a transfer chamber of a process tool (e.g., transfer chamber 110 of process tool 104) and transfer them to a factory interface (e.g., factory interface 106). Lower interior chambers 228c and 228d may be configured to receive substrates from a factory interface and transfer them to a transfer chamber of a process tool.

Each of interior chambers 228a-d may have a controlled environment, which may range from, e.g., an atmospheric-pressure inert gas environment to a vacuum environment. In some embodiments, the controlled environments of upper interior chambers 228a and 228b may be completely isolated from the controlled environments of lower interior chambers 228c and 228d. That is, upper interior chambers 228a and 228b may be maintained in, e.g., a vacuum environment, while lower interior chambers 228c and 228d may be maintained in, e.g., an atmospheric environment, and vice versa. In some embodiments, upper interior chamber 228a may be maintained in a controlled environment different than upper interior chamber 228b, and/or lower interior chamber 228c may be maintained in a controlled environment different than lower interior chamber 228d.

Loadlock 220A may include a vacuum pump 231 coupled to upper interior chambers 228a and 228b and to lower interior chambers 228c and 228d (note that flow lines, manifolds and exhaust channels, control valves, flow controllers, flow meters, etc. are not shown to maintain clarity in FIG. 2A). In some embodiments, vacuum pump 231 may be shared between upper interior chambers 228a and 228b and lower interior chambers 228c and 228d such that suitable vacuum levels can be provided to upper interior chambers 228a and 228b at a different time than lower interior chambers 228c and 228d (such as, e.g., when upper interior chambers 228a and 228b are operated alternately or at different cycle times than lower interior chambers 228c and 228d). In some embodiments, vacuum levels may be provided at a pressure range from about 0.01 Torr to about 80 Torr. Other vacuum pressures may be provided. Vacuum pump 231 may have an exhaust port 232 for evacuating, venting, and exhausting gases from upper interior chambers 228a and 228b and lower interior chambers 228c and 228d. Vacuum pump 231 may be, e.g., a BOC Edwards pump, or the like. Other vacuum pumps may be used. In some embodiments, loadlock 220A may include additional or alternative equipment (not shown) for evacuating, purging, and/or venting upper interior chambers 228a and 228b and/or lower interior chambers 228c and 228d.

Loadlock 220A may be configured to heat a gas delivered to upper interior chamber 228a and/or upper interior chamber 228b. The gas may be an inert gas, such as, e.g., nitrogen, provided by an inert gas supply 233. Other inert gases may be used, such as, e.g., helium or argon. In some embodiments, loadlock 220A may include a plurality of gas line heaters configured to heat gas delivered to upper interior chambers 228a and/or 228b. Because loadlock 220A may have limited space available in and around housing 220H and related gas lines, loadlock 220A may include multiple smaller gas line heaters located in and around housing 220H and inert gas supply 233 instead of a single larger gas line heater located near the inlets to upper interior chambers 228a and 228b. The multiple smaller gas line heaters may ensure that gas supplied to loadlock 220A is able to be heated to a desired temperature, which in some embodiments, may range from about 75 degrees C. to 95 degrees C.

In some embodiments, loadlock 220A may include a first gas line heater 234a, a second gas line heater 234b, a third gas line heater 234c, and a fourth gas line heater 234d. One or more of first gas line heater 234a, second gas line heater 234b, third gas line heater 234c, and fourth gas line heater 234d may be a gas line jacket-type heater available from, e.g., Watlow Electric Manufacturing Co. Alternatively, in-line type heaters and/or other suitable gas line heaters may be used.

First gas line heater 234a may be included in a first gas line heating zone, second gas line heater 234b may be included in a second gas line heating zone, and third gas line heater 234c and fourth gas line heater 234d may be included in a third gas line heating zone. First gas line heater 234a may be coupled to a first gas line 236a to heat a gas therein. Second gas line heater 234b may be coupled to a second gas line 236b to heat a gas therein. Third gas line heater 234c may be coupled to a third gas line 236c to heat a gas therein. And fourth gas line heater 234d may be coupled to a fourth gas line 236d to heat a gas therein.

First gas line 236a may have one end coupled to third gas line 236c at a Y-junction 237 in housing 220H. The other end of first gas line 236a may be coupled to a top of housing 220H to deliver a gas to upper interior chamber 228a via a diffuser 238a. Second gas line 236b may have one end coupled to third gas line 236c at Y-junction 237. The other end of second gas line 236b may be coupled to the top of housing 220H to deliver a gas to upper interior chamber 228b via a diffuser 238b. Diffusers 238a and 238b may each be configured to diffuse gas flow into their respective upper interior chamber 228a or 228b and may also function as a particle filter. Diffusers 238a and 238b may each be an aluminum oxide diffuser in some embodiments.

Third gas line 236c may be coupled between Y-junction 237 and inert gas supply 233. A flow controller 240 may be coupled to third gas line 236c. Fourth gas line 236d may extend parallel to a portion of third gas line 236c, wherein one end of fourth gas line 236d may be coupled to third gas line 236c downstream of third gas line heater 234c. The other end of fourth gas line 236d may be coupled to inert gas supply 233. A flow controller 242 may be coupled to fourth gas line 236d. In some embodiments, flow controller 242 may be set to a higher flow rate than flow controller 240. Thus, e.g., a higher flow rate of a gas may be provided to upper interior chambers 228a and 228b via fourth gas line 236d (and the remaining portion of third gas line 236c to first gas line 236a and/or second gas line 236b) than via third gas line 236c alone (to first gas line 236a and/or second gas line 236b).

Loadlock 220A may also include a plurality of temperature sensors 246a, 246b, and 246c (one per gas line heating zone), and a plurality of control valves 248a, 248b, 248c, and 248d. Temperature sensors 246a, 246b, and 246c may each be thermocouples or other suitable temperature sensing devices, and control valves 248a, 248b, 248c, and 248d may be one-way, two-way, or three-way type valves as needed and may be, e.g., KF-40 type gate valves or the like. Other suitable control valves may be used.

Other embodiments may have other suitable arrangements and numbers of multiple gas line heaters, gas lines, temperature sensors, and/or control valves.

Loadlock 220A may also include a gas line heater controller 250. Gas line heater controller 250 may be coupled in parallel to first gas line heater 234a (establishing the first gas line heating zone), to second gas line heater 234b (establishing the second gas line heating zone), and to third gas line heater 234c and a fourth gas line heater 234d (establishing the third gas line heating zone). This configuration allows each gas line heating zone to be separately controlled by gas line heater controller 250.

Gas line heater controller 250 may be configured to set and maintain (via software executing in gas line heater controller 250) a desired gas temperature for each gas line heating zone. For example, gas line heater controller 250 may set and maintain a first gas temperature for each of the first and second gas line heating zones and a second higher gas temperature for the third heating zone. The second higher gas temperature may account for heat losses that may occur, e.g., in third gas line 236c as a heated gas passes through housing 220H. Gas line heater controller 250 may also be configured to receive a sensed gas temperature from each of temperature sensors 246a, 246b, and 246c. Gas line heater controller 250 may be further configured to adjust, if necessary, a setting of any one or more of first gas line heater 234a, second gas line heater 234b, and third gas line heater 234c and/or fourth gas line heater 234d in response to receiving sensed gas temperatures in order to maintain the set desired gas temperatures. The setting to be adjusted may be, in some embodiments, an on/off state of the gas line heater. In other embodiments, gas line heater controller 250 may modify an electric voltage applied to one or more of the gas line heaters to modify the heat output thereof. In some embodiments, the desired temperature of heated gas to be delivered to upper interior chambers 228a and/or 228b may be about 85 degrees C. and, in some embodiments, may range from 75 degrees C. to 95 degrees C. Other suitable gas temperatures and ranges are possible. A suitable gas line heater controller 250 may be available from, e.g., Watlow Electric Manufacturing Co. Other suitable gas line heater controllers may be used.

In some embodiments, a processed substrate (e.g., a post-etched substrate) that may be received in upper interior chamber 228a or 228b from a transfer chamber may be at a temperature of about 30 degrees C. Loadlock 220A may, in some embodiments, be configured to provide a heated gas to upper interior chamber 228a or 228b, as herein described, to raise the temperature of the processed substrate by about 8-12 degrees C. to about 38-42 degrees C. A processed substrate at a temperature of about 38-42 degrees C. may be sufficient to reduce, if not prevent, any substrate outgassing from causing corrosion on any of the interior surfaces of upper interior chamber 228a or 228b. Other increases in substrate temperature to reduce, if not prevent, the adverse effects of substrate outgassing may be possible.

Furthermore, by advantageously providing a heated gas to upper interior chambers 228a and 228b to heat respective substrates therein, the costs and expenses of operating a heating pedestal and its associated hardware (e.g., substrate lifting mechanisms, drive motors, etc.) in upper interior chambers 228a and 228b may be saved.

In some embodiments, loadlock 220A may include a plurality of cartridge heaters embedded in housing 220H. The plurality of cartridge heaters may be configured to heat housing 220H such that any moisture present on interior surfaces of upper interior chambers 228a and 228b and lower interior chambers 228c and 228d may be reduced, removed entirely, and/or prevented from forming thereon. In some embodiments, as shown in FIGS. 2A-C, eight cartridge heaters 252a-h may be embedded in housing 220H, wherein cartridge heaters 252a, 252b, 252c, and 252d are shown in loadlock 220A (front view) of FIG. 2A, cartridge heaters 252a, 252b, 252c, 252d, 252e, 252f, 252g, and 252h are shown in loadlock 220B (top view) of FIG. 2B, and cartridge heaters 252c, 252d, 252g, and 252h are shown in loadlock 220C (right side view) of FIG. 2C. Each of cartridge heaters 252a-h may be inserted in an appropriately-sized hole drilled or otherwise formed in housing 220H. Cartridge heaters 252a and 252e may be embedded horizontally at the same level into the left side of housing 220H, and cartridge heaters 252d and 252h may be embedded horizontally at the same level into the right side of housing 220H. Each of cartridge heaters 252a, 252e, 252d, and 252h may be embedded horizontally at the same level and may be symmetrically spaced apart. Cartridge heaters 252b, 252c, 252f, and 252g may be embedded vertically into a bottom 253 of housing 220H. Other arrangements of cartridge heaters are possible depending on the desired heating of housing 220H. In some embodiments, cartridge heaters 252a, 252b, 252e, and 252f located around upper interior chamber 228a and lower interior chamber 228c may be coupled in parallel to form a first loadlock heating zone, and cartridge heaters 252c, 252d, 252g, and 252h located around upper interior chamber 228b and lower interior chamber 228d may be coupled in parallel to form a second loadlock heating zone. Each of cartridge heaters 252a-h may be, e.g., a FIREROD® cartridge heater available from Watlow Electric Manufacturing Co. Other suitable cartridge type heaters may be used.

In some embodiments, cartridge heaters 252a, 252b, 252c, and 252d (which are near the front side of loadlock 220A, which interfaces a factory interface) may have a lower maximum heat output than cartridge heaters 252e, 252f, 252g, and 252h (which are near the back side of loadlock 220A, which interfaces a transfer chamber). Cartridge heaters 252e, 252f, 252g, and 252h may have a higher heat output than cartridge heaters 252a, 252b, 252c, and 252d because a transfer chamber may act as a larger heat sink than a factory interface, thus requiring cartridge heaters 252e, 252f, 252g, and 252h to output more heat in order to maintain a relatively constant/uniform loadlock temperature. For example, in some embodiments, cartridge heaters 252a, 252b, 252c, and 252d may each be a 355 Watt cartridge heater, while cartridge heaters 252e, 252f, 252g, and 252h may each be a 825 Watt cartridge heater. Cartridge heaters 252a-h may each be of other suitable wattages.

Loadlock 220A may include a loadlock heater controller 254. Cartridge heaters 252a, 252b, 252e, and 252f may be coupled in parallel (forming the first loadlock heating zone) to loadlock heater controller 254, and cartridge heaters 252c, 252d, 252g, and 252h may also be coupled in parallel (forming the second loadlock heating zone) to loadlock heater controller 254. Loadlock heater controller 254 may be configured to set and maintain (via software executing in loadlock heater controller 254) a desired loadlock housing 220H temperature for each of the two loadlock heating zones. For example, loadlock heater controller 254 may set and maintain a first loadlock temperature for the first loadlock heating zone and a second loadlock temperature (which may be the same as the first loadlock temperature) for the second loadlock heating zone. The first and second loadlock temperatures may each be sufficient to reduce or prevent any moisture from forming on interior surfaces of upper interior chambers 228a and 228b and lower interior chambers 228c and 228d.

In some embodiments, loadlock heater controller 254 and cartridge heaters 252a-h may be configured to heat loadlock housing 220H (and in particular, all interior vacuum surfaces of upper interior chambers 228a and 228b and lower interior chambers 228c and 228d) to a temperature of about 55 degrees C. to about 100 degrees C. starting from room temperature within about one hour or less. Maintaining all interior vacuum surfaces of upper interior chambers 228a and 228b and lower interior chambers 228c and 228d at about 55 degrees C. to about 100 degrees C. may reduce, if not prevent, moisture from forming thereon and/or corrosion thereof.

Loadlock heater controller 254 may be configured to maintain the set first and second loadlock temperatures by receiving temperatures sensed by loadlock temperature sensors 255a and 255b (see FIGS. 2B and 2C), each of which may be a thermocouple. In response to receiving those temperatures, loadlock heater controller 254 may also be configured to adjust, if necessary, a setting of cartridge heaters 252a, 252b, 252e, and 252f (in the first loadlock heating zone) and/or a setting of cartridge heaters 252c, 252d, 252g, and 252h (in the second loadlock heating zone) in order to maintain the set first and/or second loadlock temperatures. That is, the cartridge heaters of a heating zone are operated in unison. The setting may be, in some embodiments, an on/off state of the cartridge heaters in a heating zone. In other embodiments, loadlock heater controller 254 may modify an electric voltage applied to the cartridge heaters in the first and/or second loadlock heating zones to modify the respective heat outputs thereof. A suitable loadlock heater controller 254 may be available from, e.g., Watlow Electric Manufacturing Co. Other suitable loadlock heater controllers may be used.

In some embodiments, gas line heater controller 250 and/or loadlock heater controller 254 may include a current sensor (not shown) configured to sense current supplied respectively to gas line heaters 234a-234d and cartridge heaters 252a-h. The sensed current may indicate if any of the heaters is inoperative. For example, loadlock heater controller 254 may determine that one of cartridge heaters 252a-h is inoperative if current sensed by its current sensor is proportionately less by one cartridge heater than current sensed for all cartridge heaters 252a-h.

In some embodiments gas line heater controller 250 and loadlock heater controller 254 may be replaced by a single heater controller that performs the functions of both.

Operation of loadlock 220A may be under the control of a controller 256 (FIG. 2A), which may be a system controller of an electronic device manufacturing system that includes loadlock 220A. Controller 256 may be coupled to each of the active hardware components of loadlock 220A to control operation thereof. In some embodiments, the active components may include vacuum pump 231 and control valves 248a, 248b, 248c, and 248d. Controller 256 may include a programmed processor, memory storing processor executable instructions, support circuits, and input/output circuits. While gas line heater controller 250 and/or loadlock heater controller 254 may operate independently of controller 256, each may provide information to controller 256 and/or may be controlled by controller 256. In alternative embodiments, the functions of gas line heater controller 250 and/or loadlock heater controller 254 may be performed by controller 256 and gas line heater controller 250 and/or loadlock heater controller 254 may be omitted from loadlock 220A.

Figure 3:
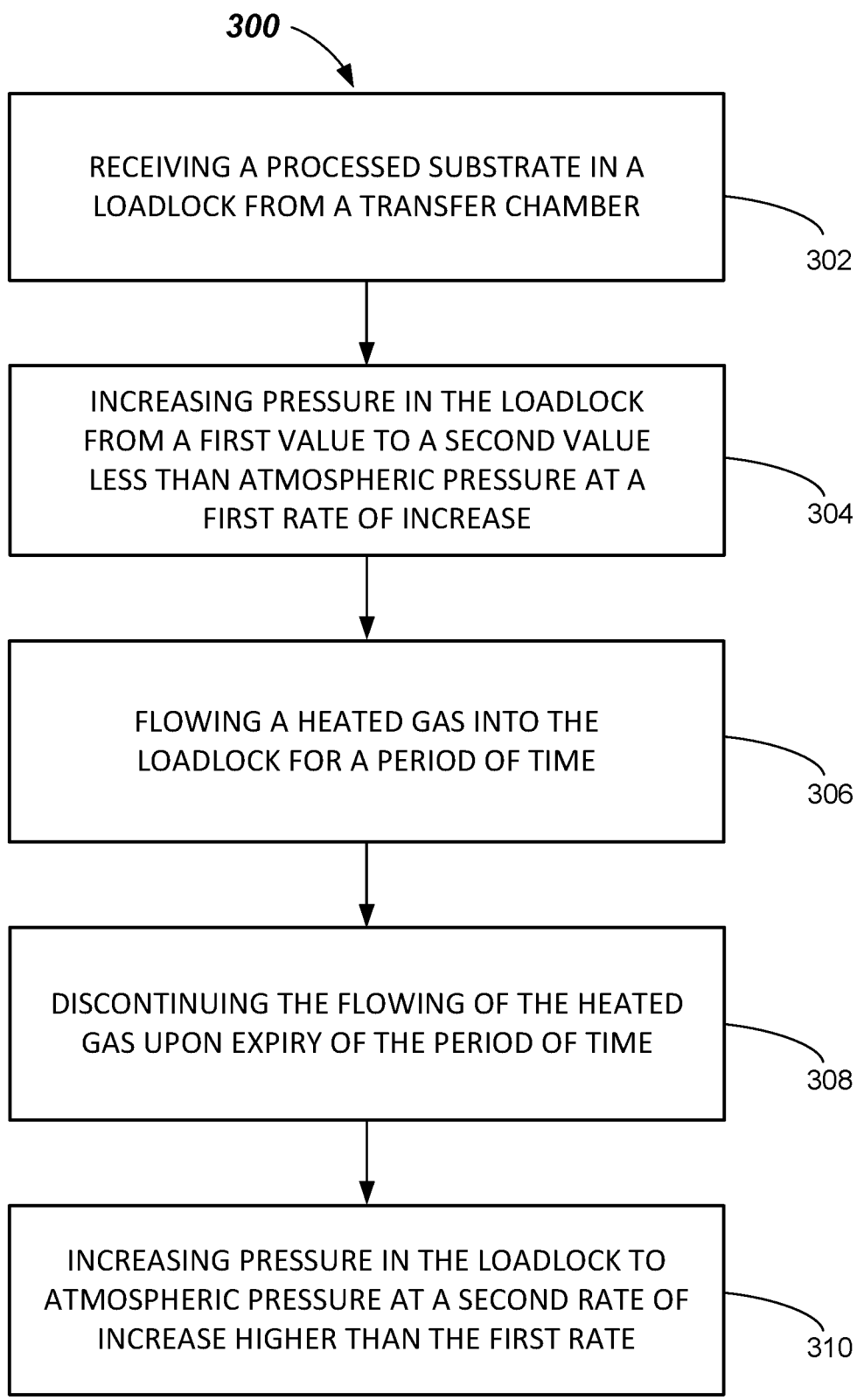
FIG. 3 illustrates a method of heating a substrate in a loadlock of an electronic device manufacturing system according to embodiments of the disclosure.

FIG. 3 illustrates a method 300 of heating a substrate in a loadlock of an electronic device manufacturing system in accordance with one or more embodiments. Method 300 may be performed by one or more controllers, such as, e.g., controller 256 and/or gas line heater controller 250 (FIG. 2A).

At process block 302, method 300 may include receiving a processed substrate in the loadlock from a transfer chamber of the electronic device manufacturing system. For example, referring to FIGS. 1 and 2A, a substrate processed in one or more of process chambers 114, 116, and 118 may be transferred from transfer chamber 110 to upper interior chamber 228a or 228b of loadlock 220A.

At process block 304, method 300 may include increasing a pressure in the loadlock from a first value to a second value at a first rate of increase, the second value less than atmospheric pressure. For example, referring to FIG. 2A, upper interior chambers 228a and 228b of loadlock 220A may be at a vacuum pressure level (i.e., the first value) upon receipt of a substrate from a transfer chamber. Controller 256 may operate any necessary control valves to open exhaust port 232 and set control valves 248a, 248b, 248c, and 248d such that inert gas flows through third gas line 236c, first gas line 236a, and second gas line 236b at a flow rate set by flow controller 240 (i.e., corresponding to the first rate of increase) until the pressure in upper interior chambers 228a and 228b rises to a second value less than atmospheric pressure. The second value may be referred to as a purge pressure value. In some embodiments, the first pressure value may range from about 220 mTorr to 180 mTorr and the second pressure value may range from about 20 Torr to 10 Torr. Note that in some embodiments, one or more of gas line heaters 234a-c may be on to provide a heated gas during this pressure increase.

At process block 306, method 300 may include flowing a heated gas into the loadlock for a period of time. For example, referring to FIG. 2A, gas line heater controller 250 may turn on gas line heaters 234a-d, and controller 256 may turn on vacuum pump 231 and set control valves 248c and 248d to allow inert gas from inert gas supply 233 to flow through fourth gas line 236d, the remaining portion of third gas line 236c, and first gas line 236a and/or second gas line 236b through loadlock 220A.

At process block 308, method 300 may include discontinuing the flowing of the heated gas upon expiry of the period of time. For example, gas line heater controller 250 may turn off gas line heaters 234a, 234b, 234c, and 234d, and controller 256 may turn off vacuum pump 231. In some embodiments, the period of time may range from about 20 seconds to 40 seconds.

And at process block 310, method 300 may include increasing the pressure in the loadlock to atmospheric pressure at a second rate of increase after the discontinuing, the second rate of increase higher than the first rate of increase. For example, referring again to FIG. 2A, inert gas may flow through fourth gas line 236d, the remaining portion of third gas line 236c, and first gas line 236a and/or second gas line 236b at a flow rate set by flow controller 242 (i.e., corresponding to the second rate of increase) until the pressure in upper interior chambers 228a and 228b rises to atmospheric pressure.

After the pressure has reached atmospheric pressure, method 300 may further include opening a loadlock door to a factory interface (e.g., factory interface 106 of FIG. 1) to remove the processed substrate from the electronic device manufacturing system for further processing.

The foregoing description discloses only example embodiments of the disclosure. Modifications of the above-disclosed apparatus, systems, and methods may fall within the scope of the disclosure. Accordingly, while example embodiments of the disclosure have been disclosed, it should be understood that other embodiments may fall within the scope of the disclosure, as defined by the following claims.

What is claimed is:

1. A loadlock of an electronic device manufacturing system comprising:
    a housing having a first interior chamber configured to receive a substrate therein from a transfer chamber of the electronic device manufacturing system;
    a plurality of gas lines coupled to the first interior chamber;
    a plurality of gas line heaters configured to heat a gas in one or more of the plurality of gas lines to deliver heated gas to the first interior chamber;
    a plurality of gas line temperature sensors coupled at different locations to the plurality of gas lines; and
    a gas line heater controller configured to receive one or more sensed gas temperatures from one or more of the plurality of gas line temperature sensors and to adjust a setting of one or more of the plurality of gas line heaters in response to receiving the one or more sensed gas temperatures.

2. The loadlock of claim 1, wherein:
    the housing has a second interior chamber configured to receive a substrate therein from the transfer chamber of the electronic device manufacturing system;
    the plurality of gas lines is coupled to the second interior chamber; and
    the plurality of gas line heaters is configured to heat a gas to be delivered to the second interior chamber.

3. The loadlock of claim 1, wherein the gas delivered to the first interior chamber is an inert gas.

4. The loadlock of claim 1, wherein at least one of the plurality of gas line temperature sensors is a thermocouple.

5. The loadlock of claim 1, further comprising a plurality of cartridge heaters embedded in the housing and configured to heat the housing.

6. The loadlock of claim 5, wherein a first sub-plurality of the cartridge heaters is included in a first loadlock heating zone and a second sub-plurality of the cartridge heaters is included in a second loadlock heating zone.

7. The loadlock of claim 6, wherein some of the first sub-plurality of the cartridge heaters have a lower maximum heat output than others of the first sub-plurality of the cartridge heaters.

8. The loadlock of claim 6, further comprising a loadlock heater controller configured to provide a set temperature of the loadlock housing by adjusting settings of the first sub-plurality of the cartridge heaters, the second sub-plurality of the cartridge heaters, or both in response to receiving one or more temperatures sensed at different locations within the loadlock housing.

9. An electronic device manufacturing system, comprising:
    a process tool including a transfer chamber;
    a factory interface; and
    a loadlock coupled between the transfer chamber and the factory interface, the loadlock comprising:
        a housing having a first interior chamber configured to receive a substrate therein from the transfer chamber;
        a plurality of gas line heaters configured to heat a gas in one or more gas lines coupled to deliver heated gas to the first interior chamber;
        a plurality of gas line temperature sensors coupled at different locations to the one or more gas lines; and
        a gas line heater controller configured to receive one or more sensed gas temperatures from one or more of the plurality of gas line temperature sensors and to adjust a setting of one or more of the plurality of gas line heaters in response to receiving the one or more sensed gas temperatures.

10. The electronic device manufacturing system of claim 9, further comprising:
    a plurality of cartridge heaters embedded in the housing and configured to heat the housing;
    a plurality of loadlock temperature sensors coupled at different locations in the housing; and
    a loadlock heater controller configured to provide a set temperature of the loadlock housing by adjusting settings of one or more of the plurality of cartridge heaters in response to receiving one or more temperatures sensed by one or more of the plurality of loadlock temperature sensors.

11. The electronic device manufacturing system of claim 10, wherein the plurality of cartridge heaters comprises eight cartridge heaters, a first four of the eight cartridge heaters included in a first heating zone and a second four of the eight cartridge heaters included in a second heating zone, the first and second heating zones each separately controlled by the loadlock heater controller.

12. The electronic device manufacturing system of claim 9, wherein the gas heated and delivered to the first interior chamber is an inert gas.

13. The electronic device manufacturing system of claim 9, wherein the plurality of gas line heaters comprises at least three gas line heaters, each included in a different heating zone separately controlled by the gas line heater controller.

14. A method comprising:
    receiving, by a loadlock of an electronic device manufacturing system, a substrate into a first interior chamber of a housing from a transfer chamber of the electronic device manufacturing system;
    heating, by a plurality of gas line heaters, gas in one or more of a plurality of gas lines coupled to the first interior chamber;
    receiving a gas temperature from gas line temperature sensors coupled at different locations to the plurality of gas lines; and
    adjusting a setting of one or more of the plurality of gas line heaters in response to receiving the one or more sensed gas temperatures.

15. The method of claim 14, further comprising:
    receiving a second substrate into a second interior chamber of the housing from the transfer chamber; and
    heating, by the plurality of gas line heaters, gas in one or more of the plurality of gas lines that are also coupled to the second interior chamber.

16. The method of claim 14, wherein the gas delivered to the first interior chamber is an inert gas.

17. The method of claim 14, further comprising heating the housing with a plurality of cartridge heaters embedded in the housing.

18. The method of claim 17, further comprising:
    positioning a first sub-plurality of the cartridge heaters in a first loadlock heating zone of the electronic device manufacturing system; and
    positioning a second sub-plurality of the cartridge heaters in a second loadlock heating zone of the electronic device manufacturing system.

19. The method of claim 18, wherein some of the first sub-plurality of the cartridge heaters have a lower maximum heat output than others of the first sub-plurality of the cartridge heaters.

20. The method of claim 18, further comprising providing, by a loadlock heater controller, a set temperature of the loadlock by adjusting settings of the first sub-plurality of the cartridge heaters, the second sub-plurality of the cartridge heaters, or both in response to receiving one or more temperatures sensed at different locations within the loadlock housing.

* * * * *